(12) United States Patent
Wakamoto

(10) Patent No.: US 7,023,521 B2
(45) Date of Patent: Apr. 4, 2006

(54) EXPOSURE APPARATUS, EXPOSURE METHOD AND PROCESS FOR PRODUCING DEVICE

(75) Inventor: Shinji Wakamoto, Kumagaya (JP)

(73) Assignee: Nikon Corporation, Tokyo (JP)

( * ) Notice: Subject to any disclaimer, the term of this patent is extended or adjusted under 35 U.S.C. 154(b) by 268 days.

(21) Appl. No.: 10/278,972

(22) Filed: Oct. 24, 2002

(65) Prior Publication Data

US 2003/0058423 A1 Mar. 27, 2003

Related U.S. Application Data

(63) Continuation of application No. 09/548,345, filed on Apr. 12, 2000, now abandoned.

(30) Foreign Application Priority Data

Apr. 13, 1999 (JP) ............................ 11-105410

(51) Int. Cl.
G03B 27/42 (2006.01)
G03B 27/54 (2006.01)
G03B 27/52 (2006.01)

(52) U.S. Cl. .............................. 355/53; 355/67; 355/55
(58) Field of Classification Search ................... 355/53, 355/55, 62, 63, 77; 250/548; 356/399, 400, 356/401
See application file for complete search history.

(56) References Cited

U.S. PATENT DOCUMENTS 5,448,332 A    9/1995  Sakakibara et al.
5,461,237 A   10/1995  Wakamoto et al.
5,502,311 A    3/1996  Imai et al.
5,737,063 A    4/1998  Miyachi ...................... 355/53
H1774 H    1/1999  Miyachi ...................... 355/67
6,118,515 A    9/2000  Wakamoto et al. ........... 355/53
6,341,007 B1   1/2002  Nishi et al. .................... 355/53
2001/0019111 A1    9/2001  Yamada et al. ............. 250/548

FOREIGN PATENT DOCUMENTS

| EP | 0 867 771 A2 | 9/1998 |
| JP | A-9-247916 | 9/1997 |
| JP | A-9-306833 | 11/1997 |
| JP | A-10-32087 | 2/1998 |
| JP | 10-41150 | 2/1998 |
| JP | A-10-116877 | 6/1998 |
| JP | 10-163100 | 6/1998 |

*Primary Examiner*—Peter B. Kim
(74) *Attorney, Agent, or Firm*—Oliff & Berridge, PLC

(57) ABSTRACT

Disclosed is a step-and-scan exposure method improved in exposure at a periphery of a wafer. An area illuminated by an exposure beam is made to relatively scan a shot area positioned at the wafer periphery from the outside of the wafer to the inside. Predetermined measurement points of a sensor for detecting positional information of a wafer with respect to a focal position of a projection optical system in the direction of the optical axis of the projection optical system are made to relatively scan along with the illumination area of the exposure beam. Focus control is performed to make the wafer move in the direction of the optical axis when only part of the selected predetermined measurement positions reach the wafer, and leveling control is performed in addition to adjust the tilt of the wafer when all of the selected predetermined measurement positions reach the wafer.

21 Claims, 7 Drawing Sheets

← SCANNING DIRECTION Y

US 7,023,521 B2

EXPOSURE APPARATUS, EXPOSURE METHOD AND PROCESS FOR PRODUCING DEVICE

This is a Continuation of application Ser. No. 09/548,345 filed Apr. 12, 2000 now abandoned. The entire disclosure of the prior application is hereby incorporated by reference herein in its entirety.

BACKGROUND OF THE INVENTION

1. Field of the Invention

The present invention relates to an exposure apparatus, exposure method, and process for production of a device, more particularly relates to an exposure apparatus, exposure method, and process for production of a device in so-called step-and-scan exposure able to prevent defocus at the time of exposure at a periphery of a substrate and, further, superior in productivity.

2. Description of the Related Art

In the lithographic process which is one of the steps in the production of a semiconductor device, as the exposure apparatus for transferring a pattern formed on a mask (including a reticle) onto a wafer coated with a photoresist, frequent use is being made of a step-and-repeat exposure apparatus for reducing and projecting the image of the mask pattern onto a shot area of the wafer.

Recently, further, use has been made of a step-and-scan exposure apparatus for making a mask and wafer move synchronously with respect to a projection optical system while reducing and projecting part of a pattern on the mask through a projection optical system onto the wafer at a slit-like illumination area for exposure. This type of exposure apparatus has the advantage over the so-called step-and-repeat exposure apparatus that there is no increase of the load on the projection optical system and the pattern transferred can be made larger in area.

This step-and-scan projection exposure apparatus illuminates a slit-like area of the wafer and makes the substrate move relatively in the short direction of the slit-like area irradiated by the exposure beam for exposure. Further, immediately before exposure, it uses a sensor to find information on the position of the surface of the wafer in the direction of the optical axis (focus information) at the exposure position in a shot area to be exposed, continuously changes the posture of a stage carrying the wafer in accordance with the scanning motion, and controls the posture to keep the optimal image plane of the exposure apparatus in register with the surface of the wafer as much as possible at all times.

In such scanning exposure, when exposing a shot area at the center portion, that is, other than at the wafer periphery, the focus information of the wafer immediately before the start of exposure can be easily detected, so there is no problem.

When exposing a shot area at the periphery of the wafer, however, if scanning a slit-like area irradiated by the exposure beam starting from outside the wafer, the scan is started from a location where the position in the direction of the optical axis cannot be predicted, therefore there is the problem that exposure tends to be performed in a defocused state. Further, when exposing a shot area at the wafer periphery, the leveling control is insufficient, so there is the problem that defocus easily occurs at the time of exposure.

Therefore, when exposing a shot area at the wafer periphery, the method of relative scanning from the inside of the wafer to the periphery for exposure is sometimes used. With this method, however, it is necessary to move for scanning in a direction opposite from the previous shot area in only shot areas at the wafer periphery and there is therefore the problem that there is inevitably a decline in the throughput.

To solve these problems, as a means for judgement of whether to perform only focus control or leveling control based on the correspondence of the position of the wafer periphery and position of the shot area, the systems of Japanese Patent Application No. 9-247916 and Japanese Patent Application No. 10-32087 have been previously proposed by the present assignee. In these systems, only focus control or leveling control is performed when predetermined measurement positions of a focus detection sensor are reached to the wafer, but this is predicated on no switching of control once having started.

When scanning an exposure area from the inside of the wafer to the outside, leveling is possible and defocus can be prevented, but when scanning from the outside of the wafer to the inside, in many cases, leveling is not possible and only the focus ends up being controlled, so defocus easily occurs in a shot.

SUMMARY OF THE INVENTION

An object of the present invention is to provide an exposure apparatus, an exposure method, and a process for production of a device in a so-called step-and-scan system exposure system enabling prevention of defocus and superior in productivity (throughput).

To achieve this object, according to the present invention, there is provided a first exposure apparatus making a mask and substrate move synchronously with respect to a projection optical system so as to transfer a pattern on the mask to the substrate, the exposure apparatus comprising:

a sensor able to detect positional information of the substrate in a direction of the optical axis of the projection optical system at a plurality of measurement positions, adjusting means of focusing control for adjusting a relative position in the direction of the optical axis between the substrate and an image plane of the projection optical system and leveling control for adjusting a relative tilt between the substrate and the image plane, and a control switching means for switching control during scanning exposure of the substrate so as to perform only the focusing control when only part of selected predetermined measurement positions of the sensor are positioned inside an effective area of the substrate and so as to additionally perform leveling control when all the selected predetermined measurement positions are positioned inside the effective area of the substrate.

According to the present invention, there is provided a second exposure apparatus using an exposure beam to illuminate a substrate through a mask and projection optical system and making an illumination area of the exposure beam relatively scan the substrate so as to transfer a pattern on the mask to the substrate, the exposure apparatus comprising:

a detecting means for detecting Z-axial positional information along a direction substantially perpendicular to an image plane of the projection optical system at a plurality of measurement points set at positions in a predetermined relationship with respect to the illumination area and a posture control means for controlling the posture of the substrate with respect to the image plane based on the Z-axial positional information during the scanning exposure, the posture control means including a switching means for switching between a first control for performing only focusing control for the substrate with respect to the image plane and a second control for performing both focusing control and leveling control for the substrate with respect to the image plane in accordance with a relative positional relationship between the plurality of measurement points and the substrate during the scanning exposure.

To achieve the above object, according to the present invention, there is provided a first exposure method making a mask and substrate move synchronously with respect to a projection optical system so as to make an illumination area of an exposure beam passing through the projection optical system relatively scan a shot area on the substrate to expose the shot area, comprising the steps of:

making the illumination area of the exposure beam relatively scan a shot area positioned at a periphery of the substrate from the outside of the substrate to the inside, performing only focusing control for adjusting a relative position in the direction of the optical axis between the substrate and the image plane of the projection optical system from when only part of selected predetermined measurement positions for detection of positional information of the substrate in the direction of the optical axis of the projection optical system are positioned inside an effective area of the substrate, and performing additionally leveling control for adjusting a relative tilt between the substrate and the image plane from when all of the selected predetermined measurement positions are positioned inside the effective area of the substrate.

According to the present invention, there is provided a second exposure method using an exposure beam to illuminate a substrate through a mask and projection optical system and making the illumination area of the exposure beam relatively scan the substrate so as to transfer a pattern on the mask to the substrate, the method comprising the steps of:

detecting Z-axial positional information along a direction substantially perpendicular to an image plane of the projection optical system at a plurality of measurement points set at positions in a predetermined relationship with respect to the illumination area and controlling a posture of the substrate with respect to the image plane based on the Z-axial positional information during the scanning exposure, the step of controlling the posture including a step of switching between a first control for performing only focusing control for the substrate with respect to the image plane and a second control for performing both focusing control and leveling control for the substrate with respect to the image plane based on relative positional relationship between the plurality of measurement points and the substrate during the scanning exposure.

According to the present invention, there is provided a first process for production of a device comprising the steps of:

making an illumination area of an exposure beam relatively scan a shot area positioned at a periphery of a substrate from the outside of the substrate to the inside, performing only focusing control for adjusting a relative position in the direction of the optical axis between the substrate and an image plane of a projection optical system from when only part of selected predetermined measurement positions for detection of positional information of the substrate in the direction of the optical axis of the projection optical system are positioned inside an effective area of the substrate, performing additionally leveling control for adjusting a relative tilt between the substrate and the image plane from when all of the selected predetermined measurement positions are positioned inside the effective area of the substrate, and making a mask and substrate move synchronously with respect to the projection optical system so as to make an illumination area of the exposure beam passing through the projection optical system relatively scan a shot area on the substrate to expose the shot area and transfer the pattern of the mask on to the substrate.

According to the present invention, there is provided a second process for production of a device comprising the steps of:

detecting Z-axial positional information of a substrate along a direction substantially perpendicular to an image plane of the projection optical system at a plurality of measurement points set at positions in a predetermined relationship with respect to an illumination area, controlling the posture of the substrate with respect to the image plane based on the Z-axial positional information during scanning exposure, switching between a first control for performing only focusing control for the substrate with respect to the image plane and a second control for performing both focusing control and leveling control for the substrate with respect to the image plane in accordance with relative positional relationship between the plurality of measurement points and the substrate during the scanning exposure at the time of controlling the posture, and using an exposure beam to illuminate the substrate through a mask and the projection optical system and making the illumination area of the exposure beam relatively scan the substrate so as to transfer a pattern on the mask to the substrate.

According to the present invention, there is provided a first process for production of an exposure apparatus for making a mask and substrate move synchronously with respect to a projection optical system so as transfer a pattern of the mask on to the substrate, comprising:

providing a sensor able to detect positional information of the substrate in the direction of the optical axis of the projection optical system at a plurality of measurement positions, providing adjusting means of focusing control for adjusting a relative position in the direction of the optical axis between the substrate and an image plane of the projection optical system and leveling control for adjusting a relative tilt between the substrate and the image plane based on the a result of detection of the sensor, and providing a control switching means for switching control during scanning exposure of the substrate so as to perform only the focusing control when only part of the selected predetermined measurement positions of the sensor are positioned inside an effective area of the substrate and so as to additionally perform leveling control when all the selected predetermined measurement positions are positioned inside the effective area of the substrate.

According to the present invention, there is provided a second process of production of an exposure apparatus using an exposure beam to illuminate a substrate through a mask and projection optical system and making an illumination area of the exposure beam relatively scan the substrate so as to transfer a pattern on the mask to the substrate, comprising the steps of:

providing a detecting means for detecting Z-axial positional information along a direction substantially perpendicular to an image plane of the projection optical system at a plurality of measurement points set at positions in a predetermined relationship with respect to the illumination area and providing a posture control means for controlling the posture of the substrate with respect to the image plane based on the Z-axial positional information during the scanning exposure and including a switching means for switching during scanning exposure between a first control for performing only focusing control for the substrate with respect to the image plane and a second control for performing both focusing control and leveling control for the substrate with respect to the image plane based on a relative positional relationship between the plurality of measurement points and the substrate.

In the present invention, when performing scanning exposure from the outside of the substrate to the inside, by switching from control of only the focusing to control of leveling as well when the number of measurement positions or measurement points of the sensor or detecting means on the substrate increases, it is possible to prevent defocus. Further, since scanning exposure from the outside of the substrate also becomes possible, the productivity (throughput) is also improved.

In the present invention, further provision is preferably made of a determining means for determining selected predetermined measurement positions or measurement points of the sensor or detecting means based on which position on the substrate a shot area of the substrate is at.

When the shot area of the substrate is at the periphery of the substrate, it is preferable to define a length required for leveling control in a non-scanning direction perpendicular to a direction of synchronous movement of the substrate as L1 and a length of the shot area on the substrate in the non-scanning direction as L2, to hypothesize, inside the shot area, a surface area S1 of a first rectangular shape having a side of a length of the length L1, having a first corner intersect with an edge of the substrate, and having an opposite corner of the first corner overlap with a corner of the shot area close to the center of the substrate, to hypothesize, inside the shot area, a surface area S2 of a second rectangular shape having a side of a length of the length L2, having a second corner intersect with an edge of the substrate, and having an opposite corner of the second corner overlap with a corner of the shot area close to the center of the substrate, to compare the surface area S1 of the first rectangular shape and the surface area S2 of the second rectangular shape and have the measurement positions positioned inside the larger surface area determined by the determining means as the selected predetermined measurement positions of the sensor.

That is, in the present invention in this case, the minimum length L1 required for the leveling control is set in advance. When the interval between the measurement positions of the sensor is small, the error in calculation of the plane in the leveling ends up becoming large, so it is necessary to secure a certain lateral length as the length L1. The remaining exposure length is calculated from the position intersecting the edge of the substrate enabling the lateral length L1 of the shot area to be secured and is defined as M1. The area of L1×M1 is defined as S1. On the other hand, the remaining exposure length is calculated from the position intersecting the edge of the substrate enabling the lateral length L2 of the shot area to be secured and is defined as M2. The area of L2×M2 is defined as S2. By comparing the surface areas S1 and S2 and giving priority to the larger area in selection in the sensor, it becomes possible to obtain a large area in a shot on which leveling control is performed, the accuracy of the leveling control is improved, and defocus can be further prevented. Note that when the measurement positions of the sensor are arranged at equal intervals in the non-scanning direction, it is also possible to determine the length L1 by a fixed number of measurement positions.

In the present invention, the leveling control may also be performed only in the non-scanning direction perpendicularly intersecting the direction of synchronous movement of the mask and substrate.

The invention in this case is a control sequence utilizing the fact that leveling control in the scanning direction has little effect on the imaging. By not performing the leveling control in the scanning direction and performing leveling control in only the non-scanning direction, it is possible to start the leveling control at a timing earlier than the case of also performing leveling control in the scanning direction and possible to further prevent defocus.

Note that in the present invention, it is effective to combine the invention disclosed in Japanese Patent Application No. 10-041150. That is, in a shot area before a shot area to be scanned from the outside of the substrate to the inside, the scan is performed from the inside of the substrate to the outside so as to improve the throughput. In this case, storing the position in the direction of the optical axis and tilt of the substrate at a timing when the control ends is also effective in the present invention. When starting the method of the present invention, by holding the position in the direction of the optical axis and tilt of the substrate at the timing when control at the previous shot area ended and working the method of the present invention from that state, it is possible to start the scan from a state where the focusing position and leveling plane are substantially adjusted. As a result, it is possible to shorten the time until the optimal image plane of the optical system and the actual plane of the substrate are adjusted, possible to prevent defocus, and improve the throughput as well.

Further, in the present invention, "mask" is used in the sense including a reticle.

BRIEF DESCRIPTION OF THE DRAWINGS

These and other objects and features of the present invention will become clearer from the following description of the preferred embodiments given with reference to the accompanying drawings, wherein.

DESCRIPTION OF THE PREFERRED EMBODIMENTS

First Embodiment

First, the overall configuration of an exposure apparatus according to a first embodiment of the present invention will be explained based on FIG. 1.

Figure 1:
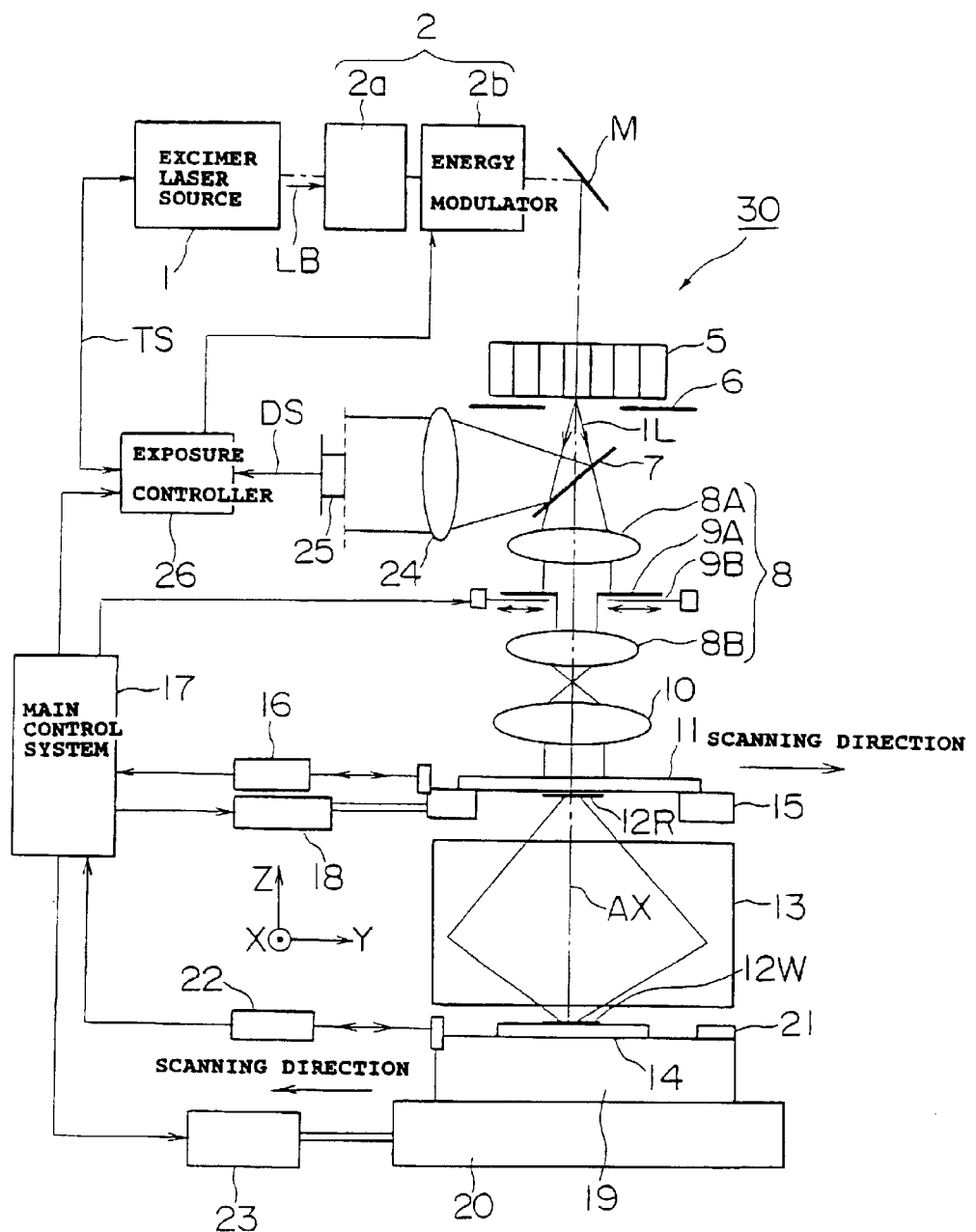
FIG. 1 is a schematic view of a scanning exposure apparatus according to an embodiment of the present invention.

As shown in FIG. 1, the exposure apparatus 30 of the present embodiment has for example a KrF excimer laser (oscillation wavelength 248 nm) as the exposure light source 1. Note that as the exposure light source 1, it is also possible to use a metal vapor laser light source or a YAG laser harmonic generator or other pulse light source.

A light beam LB emitted in pulses from the exposure light source 1 strikes a beam shaping and modulation optical system 2. In the present embodiment, the beam shaping and modulation optical system 2 is comprised of a beam shaping optical system 2 and an energy modulator 2b. The beam shaping optical system 2a is comprised by a cylinder lens or a beam expander etc. The beam is shaped sectionally by these so as to efficiently strike the later fly-eye lens 5.

The energy modulator 2b is comprised by a rough energy modulator and a fine energy modulator. The rough energy modulator is comprised of a plurality of ND filters of different transmittances (=(1-light attenuation rate)×100(%)) arranged on a rotatable revolver. By rotating the revolver, it is possible to switch the transmittance with respect to the incident laser beam LB in several stages from 100%. Note that it is also possible to arrange two revolvers, that is, that revolver and a similar revolver, and adjust the transmittance more finely by combination of two sets of ND filters. On the other hand, the fine energy modulator is for continuous fine adjustment of the transmittance with respect to the laser beam LB within a predetermined range by a double grating system or variable tilt angle system comprising a combination of two parallel flat sheets of glass. Instead of using this fine energy modulator, however, it is also possible to finely adjust the energy of the laser beam LB by the modulation of the output of the excimer laser light source 1.

The laser beam LB emitted from the beam shaping and modulation optical system 2 is guided via the light path bending mirror M to strike the fly-eye lens 5. The fly-eye lens 5 forms a plurality of secondary light sources for illuminating the following reticle 11 by a uniform illumination. A blind 6 of the illumination system (so-called σ-blind) is arranged at the emitting face of the fly-eye lens 5. The laser beam emitted from a second light source in the blind 6 (hereinafter referred to as the "pulse illumination light IL") strikes the small reflectance, large transmittance beam splitter 7, while the pulse illumination light IL serving as the exposure illumination light passing through the beam splitter 7 is guided via the relay lens 8 to strike the condenser lens 10.

The relay lens 8 has a first relay lens 8A, a second relay lens 8B, and a fixed reticle blind 9A and movable reticle blind 9B arranged between these lenses 8A and 8B. The fixed reticle blind 9A has a rectangular aperture. Pulse illumination light IL passing through the beam splitter 7 passes via the first relay lens 8A through the rectangular aperture of the fixed reticle blind 9A. Further, the fixed reticle blind 9A is arranged near the conjugate plane for the pattern surface of the reticle. The movable reticle blind 9B has an aperture with a variable position in the scanning direction and width and is arranged close to the fixed reticle blind 9A. By further limiting the illumination area through the movable reticle blind 9B at the time of the start and end of the scanning exposure, exposure of unnecessary portions (other than shot areas on the wafer to which the reticle pattern is transferred) is prevented.

The pulse illumination light IL passing through the fixed reticle blind 9A and movable reticle blind 9B is guided via the second relay lens 8B and condenser lens 10 to illuminate by a uniform illumination distribution the slit-like illumination area 12R on the reticle held on the reticle stage 15. The image of the pattern in the illumination area 12R on the reticle 11 reduced via the projection optical system 13 by a projection magnification $\alpha$($\alpha$ is for example ¼, ⅕, etc.) is projected and exposed on to the narrow slit-like illumination area 12W on the wafer (exposure substrate) 14 coated with the photoresist. Below, the explanation will be made with reference to a Z-axis taken parallel to the optical axis AX of the projection optical system 13 and using the scanning direction of the reticle 11 with respect to the illumination area 12R in the plane perpendicular to the optical axis AX (that is, the direction parallel to the surface of the paper of FIG. 3) as the Y-direction and the non-scanning direction perpendicular to the scanning direction as the X-direction.

At this time, the reticle stage 15 is moved for scanning in the Y-direction by a reticle stage drive 18. The Y-coordinate of the reticle stage 15 measured by an external laser interferometer 16 is supplied to a main control system 17. The main control system 17 controls the position and speed of the reticle stage 15 through the reticle stage drive 18 based on the supplied coordinate.

On the other hand, the wafer 14 is placed on a Z-tilt stage (substrate stage) 19 through a not shown wafer holder. The Z-tilt stage 19 is placed on an XY stage 20. The XY stage 20 positions the wafer 14 in the X-direction and Y-direction and moves the wafer 14 for scanning in the Y-direction. Further, the Z-tilt stage 19 has the function of adjusting the position of the wafer 14 in the Z-direction (focusing position) and adjusting the tilt angle of the wafer 14 with respect to the XY plane. The X-coordinate and Y-coordinate of the XY stage 20 (wafer 14) measured by a movable-mirror fixed on the Z-tilt stage 19 and the external laser interferometer 22 are supplied to the main control system 17. The main control system 17 controls the position and speed of the XY stage 20 through a wafer stage drive 23 based on the supplied coordinates. Note that the posture control of the Z-tilt stage 19 will be explained later.

The operation of the main control system 17 is controlled by a not shown main control system in overall control of the apparatus as a whole. At the time of scanning exposure, in synchronization with the reticle 11 being moved for scanning at a speed $V_R$ in the +Y direction (or −Y direction) by the reticle stage 15, the wafer 14 is moved for scanning at a speed $\alpha \cdot V_R$ ($\alpha$ is the projection magnitude from the reticle 11 to the wafer 14) in the −Y direction (or +Y direction) with respect to the illumination area 12W by the XY stage 20.

Further, an illumination uniformity sensor 21 comprised of a photoelectric conversion element is provided near the wafer 14 on the Z-tilt stage 19. The light receiving face of the illumination uniformity sensor 21 is set to the same height as the surface of the wafer 14. As the illumination uniformity sensor 21, use may be made of a PIN type photodiode etc. having sensitivity in the far ultraviolet and having a high response frequency for detecting pulse illumination light. The detection signal of the illumination uniformity sensor 21 is supplied to a not shown peak hold circuit and through an analog/digital (A/D) converter to an exposure control unit 26.

Note that the pulse illumination light IL reflected at the beam splitter 7 is received by an integrator sensor 25 comprised of a photoelectric conversion element through a condenser lens 24. The photoelectric conversion signal of the integrator sensor 25 is supplied to the exposure control unit 26 as the output DS through the not shown peak hold circuit and A/D converter. The correlation coefficient of the output DS of the integrator sensor 25 and illuminance (amount of exposure) of the pulse illumination light IL on the surface of the wafer 14 is found in advance and stored in the exposure control unit 26. The exposure control unit 26 controls the timing of emission, emission power, etc. by supplying the control information TS to the exposure light source 1. The exposure control unit 26 further controls the light attenuation rate at the energy modulator 3. The main control system 17 controls the operation of the movable reticle blind 9B in synchronization with operational information of the stage system.

Figure 2:
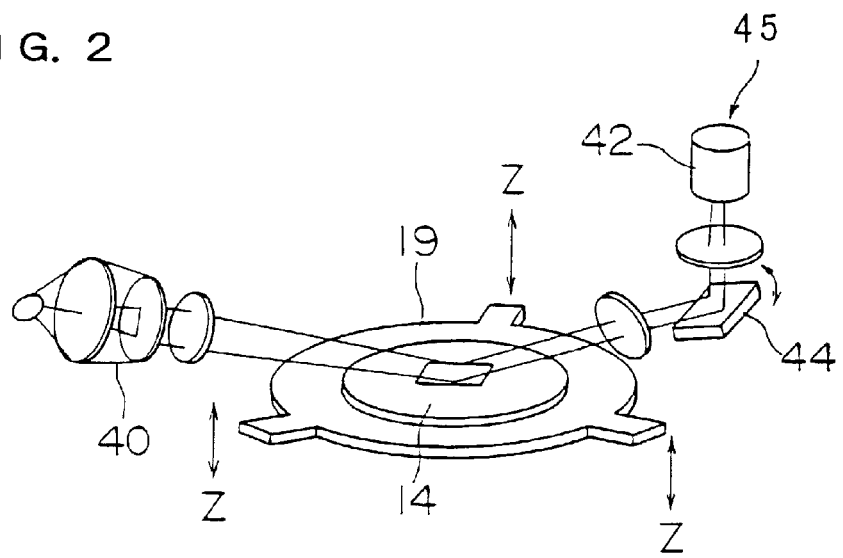
FIG. 2 is a schematic view of an example of a substrate stage posture control unit of the exposure apparatus shown in FIG. 1.

As shown in FIG. 1 and FIG. 2, the wafer 14 is held by suction by a wafer holder (not shown) on the Z-tilt stage 19. The Z-tilt stage 19 is carried on the XY-stage 20 shown in FIG. 1 through a plurality of actuators displaceable in the direction of the optical axis AX of the projection optical system 13. By making the actuators independently operate (for example, making the three support points independent) by the main control system 17 shown in FIG. 1, it is possible to freely change the position of the surface of the wafer 14 in the Z-direction along the optical axis AX of the projection optical system 13 and the tilt of the surface of the wafer 14 with respect to a plane perpendicular to the optical axis within a fine range.

The projection exposure apparatus is provided with an inclined incidence type AF sensor 45 for bringing the surface of the wafer 14 on the Z-tilt stage 19 in register with the optimal image plane of the projection optical system 13. The AF sensor 45 is comprised of a light projector 40 and a light receiver 42 as shown in FIG. 2. It projects illumination light of a non-photosensitive nature with respect to the resist of the wafer 14 and of a predetermined shape from the light projector 40 to the wafer 14 at an angle and receives the light reflected from the wafer 14 at the light receiver 42 through lenses, a mirror, etc. The light projector 40 projects measurement light to a plurality of measurement points set in advance in the image plane of the projection optical system 13 so as to give a predetermined positional relationship with respect to the slit-like illumination area 12W. The light receiver 42 has a plurality of photoelectric sensors such as CCD's corresponding to the measurement points. By detecting the reflection of the measurement light from the measurement points as changes of positions of the photoelectric sensors, it detects the posture of the surface of the wafer 14 with respect to the projection optical system 18 (position in direction of the optical axis and tilt with respect to plane orthogonal to optical axis).

Further, the mirror 44 of the light receiver 42 is a correction plate designed to be able to be finely rotated in any direction. By making the correction plate finely rotate based on a control signal from the main control system 17, it is possible to precisely adjust the posture of a predetermined reference plane of the AF sensor 45 to be in a conjugate relation with the pattern surface of the reticle 11. Note that it is also possible to fix the mirror 44 in place, arrange a correction plate comprised of a transparent sheet of glass finely rotatable in any direction on the path of the light reflected from the wafer 14, and make the correction plate finely rotate based on a control signal from the main control system 17 and thereby adjust the posture of the predetermined reference plane of the AF sensor 45.

In the present embodiment, the main control system 17 controls the posture of the Z-tilt stage 19 based on the focus information from the inclined incidence type AF sensor 45. In particular, in the present embodiment, the main control system 17 is provided with a control switching means for switching control by selecting at least one of focusing control for making the wafer 14 move in the direction of the optical axis based on the result of detection of the AF sensor 45 and leveling control for adjusting the tilt of the wafer 14 based on the result of detection of the AF sensor 45.

The control switching means is comprised of a logic circuit built into the main control system 17, a control program, etc.

When using the projection exposure apparatus 30 according to the embodiment shown in FIG. 1 for exposure of the wafer 14 shown in FIGS. 1 and 2, first, the wafer 14 is placed on the wafer holder on the Z-tilt stage 19 shown in FIG. 1 using a loader etc. Next, the surface of the wafer 14 is divided into a plurality of shot areas and these shot areas are successively scanned for exposure along the scanning direction Y. Specifically, in synchronization with the reticle 11 being moved for scanning at a speed $V_R$ in the +Y direction (or −Y direction) by the reticle stage $15_L$, the wafer 14 is moved for scanning at a speed $\alpha \cdot V_R$ ($\alpha$ is the projection magnitude from the reticle 11 to the wafer 14) in the −Y direction (or +Y direction) with respect to the illumination area 12W through the XY stage 20. As a result, the slit-like illumination area 12W formed on the surface of the wafer 14 moves relatively along the surface of the wafer 14 along the scanning direction Y and the pattern formed on the reticle 11 is transferred to the surface of the wafer 14 for every shot area.

Figure 3A:
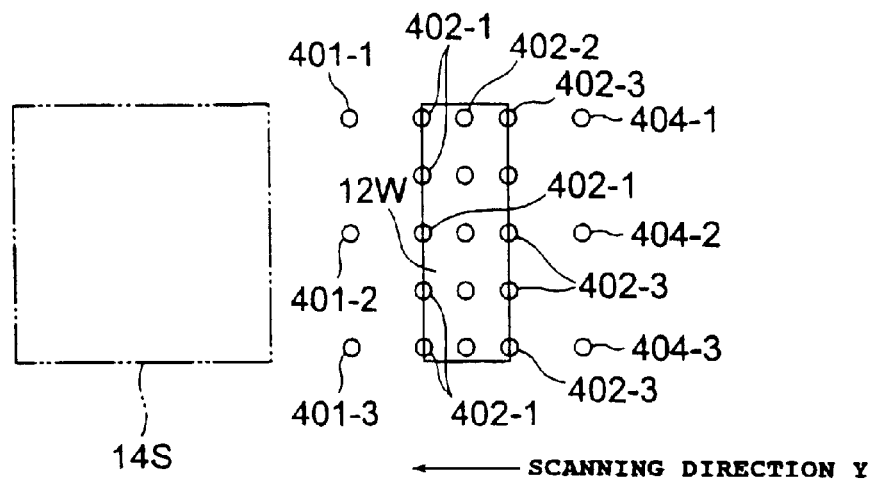
FIG. 3A is a view of the relationship between the measurement positions of a sensor for positioning in the substrate stage posture control unit and a slit-like illumination area.
Figure 3B:
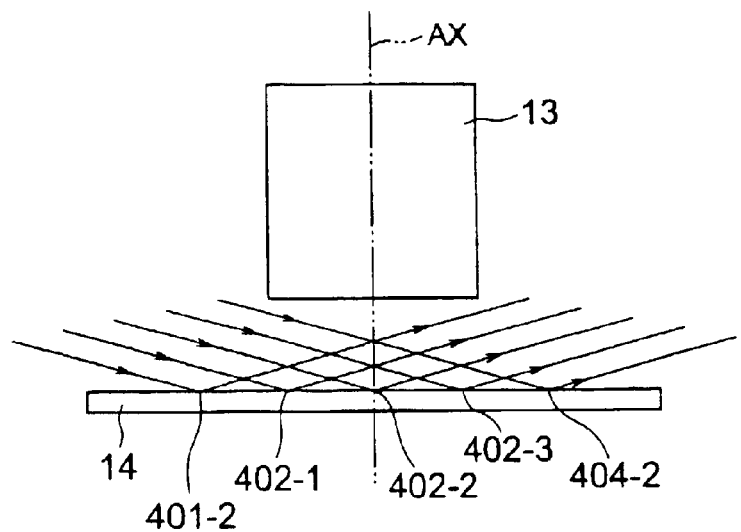
FIG. 3B is a view of the relationship between the measurement positions of the sensor and the projection optical system.

The present embodiment, for the posture control of the wafer 14, uses the inclined incidence AF sensor 45 shown in FIG. 2 for example to detect the position of the surface of the wafer 14 in the direction of the optical axis AX at a plurality of measurement positions selected from 15 measurement positions 402-1 to 402-3 in the slit-like illumination area 12W as shown in FIGS. 3A and 3B. Based on the result of detection, as explained above, the main control system 17 shown in FIG. 1 controls the Z-tilt stage 109 and independently operates the actuators of the stage 19. Further, it controls at least one of the position of the surface of the wafer 14 in the Z-direction along the optical axis AX of the projection optical system 13 and the tilt of the surface of the wafer 14 with respect to the plane orthogonal to the optical axis so as to control the posture of the wafer 14. This posture control is performed synchronously with the scanning exposure operation.

Note that as shown in FIG. 3A, even at the lookahead measurement positions 401-1 to 401-3 and 404-1 to 404-3 before and after the slit-like illumination area 12W in the scanning direction, the system preferably detects the position of the surface of the wafer 14 in the direction of the optical axis AX to detect nonuniformity or step differences of the wafer surface. A scanning exposure apparatus successively exposes new shot areas 14S of the wafer 14 during the scan, so has to quickly control the posture of the wafer 14 along with the scanning motion of the wafer 14. The system preferably detects in advance the position of the wafer surface in the Z-direction in front of the slit-like illumination area 12W in the scanning direction. By doing this, it is possible to prevent a delay in the posture control of the Z-tilt stage 19 shown in FIG. 1.

Next, the sequence of operation of the present embodiment will be explained.

Note that in the exposure apparatus of the present embodiment, the wafer 14 is moved with respect to the illumination area 12W to expose the shot area 14S on the wafer 14, but in the following description, to facilitate understanding, the explanation will be given of the illumination area 12W being moved with respect to the wafer 14.

Figure 4A:
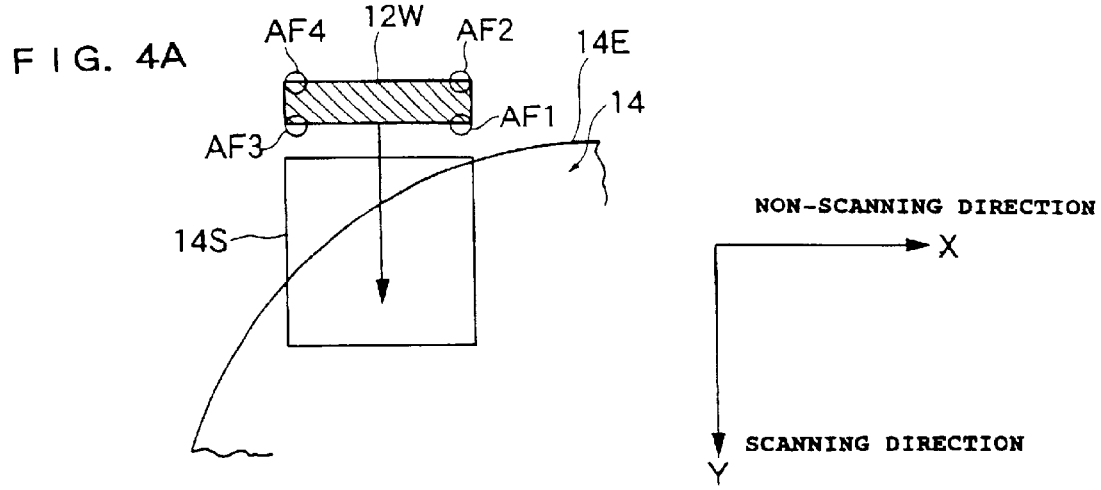
FIGS. 4A to 4C are plan views of principal portions showing the relationship among a shot area at the wafer periphery, a slit-like illumination area, and sensor measurement positions showing a scanning exposure method according to an embodiment of the present invention.
Figure 4B:
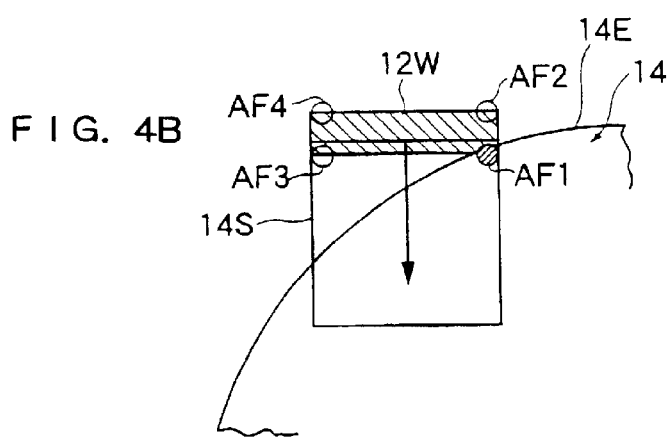
Figure 4C:
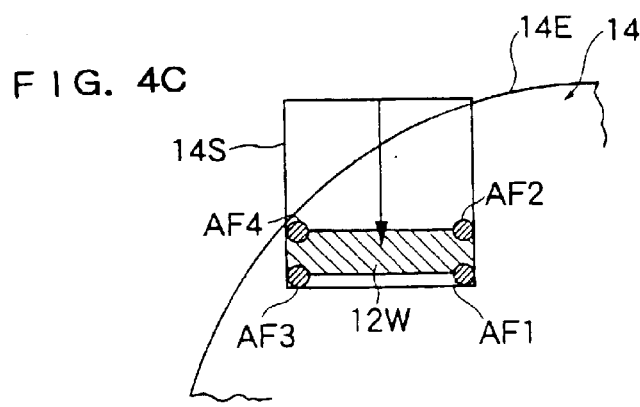

In the present embodiment, as shown in FIGS. 4A to 4C, when exposing a shot area 14S positioned at the periphery of a wafer 14, the slit-like illumination area 12W is made to move relative to the wafer 14 from the outside of the edge 14E of the wafer 14 for scanning exposure. The measurement positions AF1 to AF4 shown in FIG. 4 correspond to the measurement positions at the two ends of the measurement positions 402-1 shown in FIG. 3A and the measurement positions at the two ends of the measurement positions 402-3. In the example shown in FIG. 4, four measurement positions in the slit-like illumination area 12W are selected for the focus/leveling control. Note that the measurement positions are made freely selectable.

In the embodiment shown in FIG. 4, relative movement (scan) of the illumination area 12W and shot area 14S is started from the state of FIG. 4A. At the time of start of the scan shown in FIG. 4A, focus/leveling control is not performed. At which point of time during the scan the measurement positions AF1 to AF4 reach the wafer is calculated in advance by the main control system 17 shown in FIG. 1.

As shown in FIG. 4B, the system starts only focusing control from the time when the measurement position AF1 of the sensor first reaching the wafer reaches the wafer 14. It operates the Z-tilt stage 19 and starts the focusing control based on the focus information detected at the measurement position AF1 at that time.

Further, it makes the slit-like illumination area 12W move relative to the wafer and starts the leveling control at the time when all of the four selected measurement positions AF1 to AF4 reach the wafer 14 as shown in FIG. 4C. At the time of the leveling control, leveling control in the non-scanning direction (X-direction) perpendicular to the scanning direction of the wafer 14 (Y-direction) is performed based on the focus information of all of the selected sensors corresponding to the measurement positions AF1 to AF4. Note that the focusing control continues.

In this way, in the present embodiment, in the one shot area 14S, the system switches control so as to first control only the focus and to start leveling control in addition to focusing control from a certain point of time later.

With the exposure apparatus 30 according to the present embodiment and an exposure method using that exposure apparatus, in scanning exposure from the outside of the wafer 14 to the inside, the system controls the focus from when one measurement position AF1 among the measurement points AF1 to AF4 selected from the plurality of measurement points of the AF sensor 45 (401-1 to 401-3, 402-1 to 402-3, 404-1 to 404-3) reaches the wafer 14 and controls leveling as well after control of only the focus from when all of the selected measurement positions AF1 to AF4 reach the wafer 14. Therefore, even in exposure inside a shot area at the periphery of the wafer 14, it is possible to prevent defocus. Further, since scanning exposure from the outside of the wafer becomes possible, the productivity (throughput) is also improved.

Note that in the embodiment shown in FIG. 4, the case is shown of leveling control in both the scanning direction Y and the non-scanning direction X when the measurement positions AF1 to AF4 of all of the sensors selected during the scan reach the surface of the wafer 14. In the present invention, however, it is also possible to start the leveling control in only the non-scanning direction (lateral direction in the figure) at the point of time when the measurement positions AF1 to AF3 reach the surface of the wafer 14 when moving from FIG. 4B to FIG. 4C and then, as shown in FIG. 4C, starting the leveling control in both the scanning direction Y and non-scanning direction X when all of the selected measurement positions AF1 to AF4 reach the surface of the wafer 14.

Further, the timing for starting the leveling in the scanning direction (Y-direction) and non-scanning direction (X-direction) is not limited to the above examples. It is also possible to start the leveling control in the direction of two or more aligned measurement points when the two or more measurement points reach the surface of the wafer 14 in the scanning direction or non-scanning direction.

Second Embodiment

The overall configuration of the exposure apparatus according to the second embodiment is similar to that of the exposure apparatus 30 shown in FIG. 1, but the technique of posture control of the Z-tilt stage 19 by the main control system 17 shown in FIG. 1 differs from the case of the embodiment shown in FIG. 4. In the following description, explanations overlapping with those of the exposure apparatus and exposure method according to the first embodiment will be partially omitted and the different portions will be explained in detail.

Figure 5A:
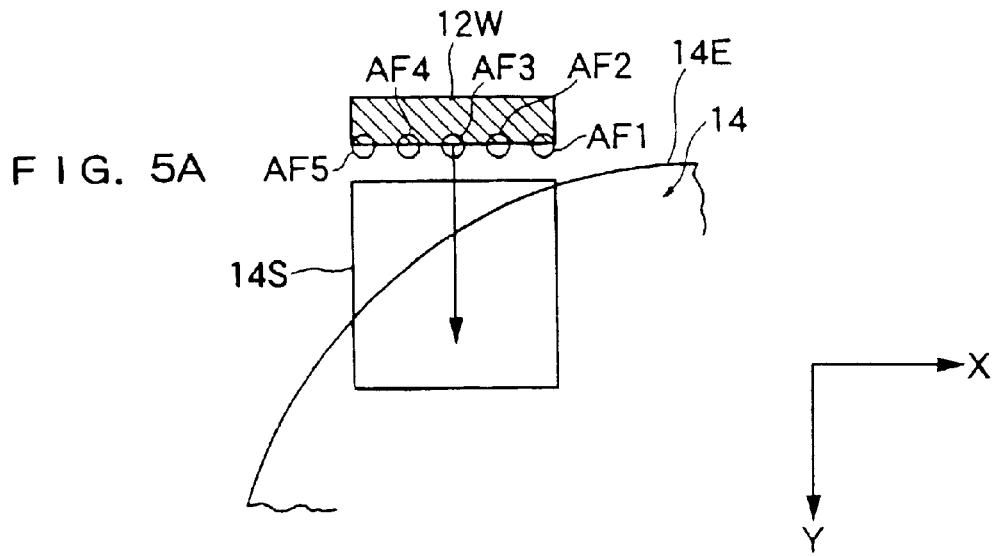
FIGS. 5A to 5C are plan views of principal portions showing the relationship among a shot area at the wafer periphery, a slit-like illumination area, and sensor measurement positions showing a scanning exposure method according to another embodiment of the present invention.

As shown in FIG. 5A, first, the system preselects measurement positions AF1 to AF5 of the row of AF sensors at the side closest to the wafer 14 first reaching the shot area 14S. Note that the five measurement positions AF1 to AF5 correspond to the five measurement positions 402-1 shown in FIG. 3A.

Figure 5B:
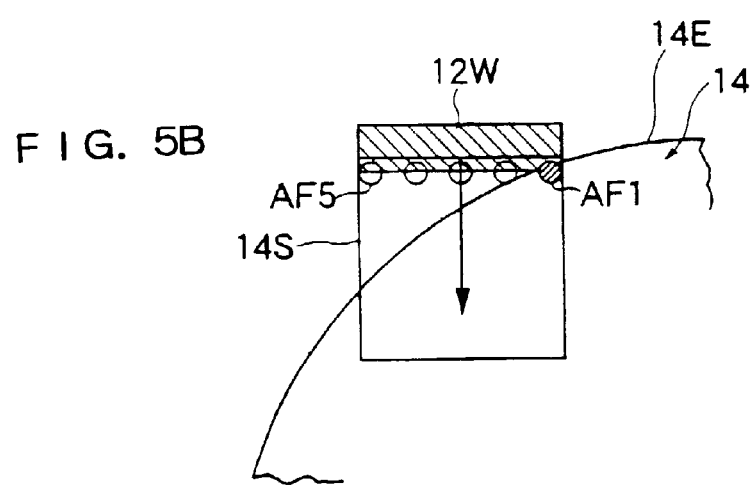
Figure 5C:
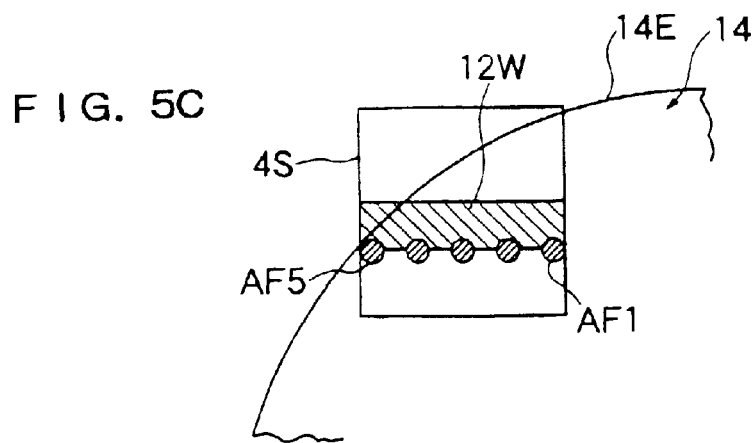

As shown in FIG. 5B, when the sensor AF1 reaching the surface of the wafer 14 first reaches the wafer 14, the system starts only focusing control using only the focus information of the measurement position AF1. It then continues the scan and, when all of the selected measurement positions AF1 to AF5 reach the surface of the wafer 14 as shown in FIG. 5C, starts leveling control in the non-scanning direction (X-direction) in addition to the focusing control. In the present embodiment, since the system selects only the plurality of measurement positions arranged along with non-scanning direction (X-direction), it can start the leveling control at a timing earlier than the case shown in the first embodiment shown in FIG. 4. The method of control of the present embodiment deems leveling in the scanning direction to have a small effect on the imaging since the length of the illumination area 12W is small and performs only leveling in the non-scanning direction.

Note that in the present embodiment, while the system selects all of the measurement positions arranged along the non-scanning direction for the leveling control, it is also possible to have it select just a part of the same. For example, it is possible for the system to preset a distance in the non-scanning direction of the measurement positions necessary for leveling control, select the plurality of measurement positions (for example, AF1 to AF3) included in that distance from among the plurality of measurement positions arranged along the non-scanning direction, and start the leveling control in the non-scanning direction after all of the selected measurement positions AF1 to AF3 reach the wafer 4 during the scan.

Further, in the present embodiment, the system performs only focusing control based on the result of measurement of the measurement position AF1 until all of the selected measurement positions AF1 to AF5 reach the wafer 14, but AF2 to AF4 also reach the wafer, so it is also possible to perform only focusing control based on the results of measurement of any one or any combination of AF1 to AF4.

Third Embodiment

The overall configuration of the exposure apparatus according to the third embodiment is similar to that of the exposure apparatus 30 shown in FIG. 1, but the technique of posture control of the Z-tilt stage 19 by the main control system 17 shown in FIG. 1 differs from the case of the embodiment shown in FIG. 4. In the following description, explanations overlapping with those of the exposure apparatus and exposure method according to the first embodiment will be partially omitted and the different portions will be explained in detail.

Figure 6:
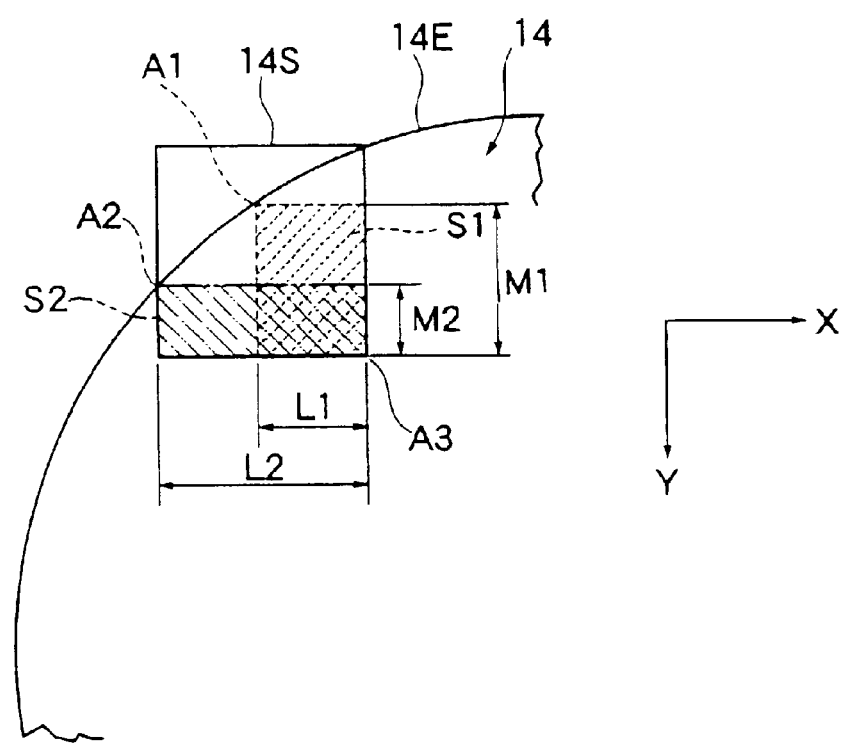
FIG. 6 is a plan view of principal portions showing the positional relationship between the wafer periphery and shot areas.

In the present embodiment, the main control system 17 shown in FIG. 1 is further provided with a determining means for determining a predetermined number df measurement positions to be selected by the AF sensor 45 shown in FIG. 2 based on which position at the periphery of the wafer 14 the shot area 14S of the wafer 14 shown in FIG. 6 is at. The predetermined measurement positions selected by the AF sensor are determined for each shot area.

In the present embodiment, when the shot area 14S at the periphery of the wafer 14 is at the position shown in FIG. 6 for example, the determining means in the main control system 17 shown in FIG. 1 performs the following judgement. That is, it defines the minimum length necessary for leveling control in the non-scanning direction X perpendicular to the scanning direction Y as shown in FIG. 6 (corresponding also to the number of sensors) as L1 and defines the length of the shot area 14 in the non-scanning direction as L2. Further, it hypothesizes, inside the shot area 14S, a surface area S1 of a first rectangular shape having a side of a length of the length L1, having a first corner A1 intersect with an edge 14E of the wafer 14, and having an opposite corner of the first corner A1 overlap with a corner A3 of the shot area 14S close to the center of the wafer 14.

Further, it hypothesizes, inside the shot area 14S, a surface area S2 of a second rectangular shape having a side of a length of the length L2, having a second corner A2 intersect with an edge 14E of the wafer 14, and having an opposite corner of the second corner A2 overlap with a corner A3 of the shot area 14S close to the center of the wafer 14.

The determining means in the main control system 17 shown in FIG. 1 compares the surface area S1 of the first rectangular shape and the surface area S2 of the second rectangular shape shown in FIG. 6 and selects the measurement positions positioned inside the larger area.

More specifically, it designates in advance the minimum lateral length L1 for leveling control. When the distance of AF sensors is small, the error in calculating the plane in the leveling ends up becoming large, so it is necessary to secure a certain lateral length as the minimum lateral length L1. It calculates the remaining exposure length from the position intersecting the wafer edge 14E enabling the lateral length L1 to be secured, makes the length in the scanning direction M1, and makes the surface area of L1×M1 S1. On the other hand, it calculates the remaining exposure length from the position intersecting the wafer edge 14E enabling the lateral length L2 of the shot area 14S to be secured, makes the length in the scanning direction M2, and makes the surface area of L2×M2 S2. It compares the surface areas S1 and S2 and gives priority to selection of the sensors in the larger area.

Figure 7A:
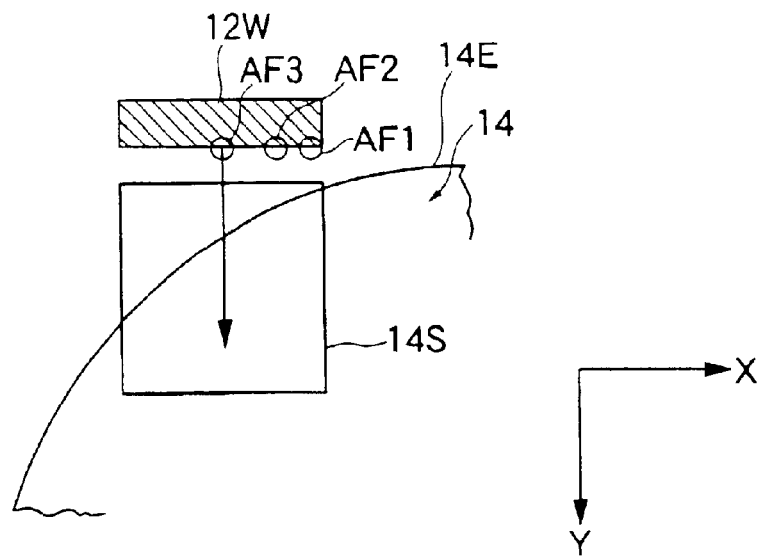
FIGS. 7A to 7C are plan views of principal portions showing the relationship among a shot area at the wafer periphery, a slit-like illumination area, and sensor measurement positions showing the scanning exposure method according to another embodiment of the present invention when in the positional relationship shown in FIG. 6.
Figure 7B:
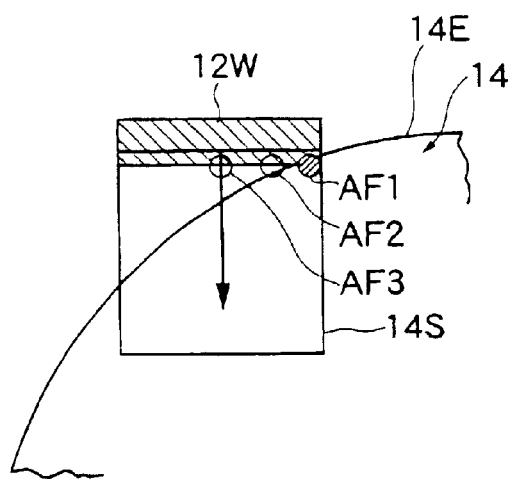
Figure 7C:
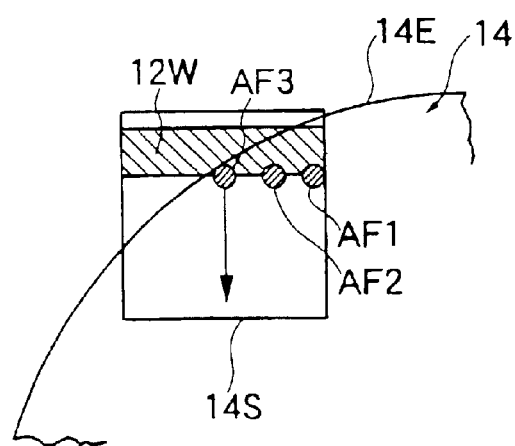

In the positional relationship between the shot area 14S and edge 14E of the wafer 14 shown in FIG. 6, the surface area S2 determined by the lateral length L1 is larger. In this case, the system determines the measurement positions to be selected from the lateral length determined by the lateral length L1 and performs controls by the sequence shown in FIGS. 7A to 7C. That is, since the surface area S1 shown in FIG. 6 is larger than the surface area S2, the measurement positions AF1 to AF3 of the sensors in the range of the surface area S2 are selected. These measurement positions AF1 to AF3 correspond to the three of the five measurement positions 402-1 at FIG. 3A from the end. The system starts the scan and, as shown in FIG. 7B, starts only the focusing control using only the focus information at the measurement position AF1 when the sensor AF1 first reaching the surface of the wafer 14 reaches the wafer 14. It further continues the scan and, as shown in FIG. 7C, starts the leveling control of the non-scanning direction X in addition to the focusing control when all of the selected (in this embodiment, three) measurement positions AF1 to AF3 reach the surface of the wafer 14.

Further, when the shot area 14S shown in FIG. 6 is at another position of the periphery of the wafer 14 and the surface area S2 is larger than the surface area S1, the determining means of the main control system 17 shown in FIG. 1 selects the measurement positions AF1 to AF5 present inside the surface area S2 as shown in for example FIGS. 5A to 5C and performs similar control as the above second embodiment.

In the exposure method according to the present embodiment, since the predetermined number of measurement positions to be selected are optimized in accordance with the shot area, it becomes possible to obtain a large surface area inside a shot area able to be subjected to leveling control, the accuracy of the leveling control is improved, and defocus can be further prevented.

Note that in the present embodiment, when the measurement positions of the focusing sensors are arranged at equal intervals in the non-scanning direction, it is also possible to determine the length L1 by the number of measurement positions set.

Further, in the above embodiment, to facilitate the explanation, the entire surface of the wafer was made the effective area for formation of the pattern, only focusing control was started when one of the selected plurality of measurement positions reached the wafer 14, and leveling control was performed along with the focusing control when all of the selected plurality of measurement positions reached the wafer 14, but when a prohibit band is provided at the peripheral edge of the wafer 14, it is sufficient to make the inside of the prohibit band the effective area, start only the focusing control when one of the selected plurality of measurement positions reaches the effective area inside of the prohibit band, and perform the leveling control along with the focusing control when all of the selected plurality of measurement positions reach the effective area at the inside of the prohibit band.

Further, in the above embodiment, the explanation was given of the case where the initial measurement position reached the effective area of the wafer 14 from the start of the exposure of the shot area 14S on the wafer 14, but depending on the position of the shot area 14S on the wafer 14, there are cases where the initial measurement position reaches the effective area of the wafer 14 during the accelerated motion of the wafer 14 or during the settling operation before the start of the exposure. In this case as well, it is possible to start only the focusing control when the initial measurement position reaches the effective area of the wafer 14 in the same way as in the above embodiment.

Further, when all of the selected measurement position reach the effective area of the wafer 14 during accelerated motion of the wafer 14 or during the settling operation before the start of the exposure of the shot area 14S as well, it is possible to start the leveling control in addition to the focusing control in the same way as in the above embodiment when all of the selected measurement positions reach the effective area of the wafer 14.

Further, it is also possible to consider uniformity information such as process step differences on the wafer 14, select a plurality of measurement points giving the optimal measurement results, and then perform the above operational sequence.

Further, up until the initial measurement position reaches the effective area of the wafer 14, as described in the previously filed Japanese Patent Application No. 10-41150 of the same assignee, it is possible to set the Z-direction position and tilt of the wafer 14 immediately before the completion of exposure (when illumination area 12W moves away from the wafer 14) at the time of exposure so that the illumination area 12W scans the immediately prior shot area from the inside of the wafer 14 to the outside.

Still further, for a specific shot area at the periphery where the measurement positions of the AF sensor 45 do not sufficiently reach the effective area of the wafer 14, it is also possible to perform focusing control based on the results of measurement of the sensor 45 and perform the leveling control openly without the use of the results of measurement of the AF sensor 45. In this case, it is preferable to predict a target value of the leveling control of the specific shot area based on the results of measurement of the AF sensor 45 during the search for alignment information of some shot areas or during scanning exposure of an adjoining shot area as disclosed in Japanese Unexamined Patent Publication (Kokai) No. 61-44429and perform open leveling control based on that target value.

Further, the measurement points (AF1 to AF5) in the above first to third embodiments were selected from 21 measurement points (401-1 to 401-3, 402-1 to 402-3, and 404-1 to 404-3), arranged in the illumination area 12W, but the measurement points may also be selected from for example the lookahead measurement points 401-1 to 401-3 (or 404-1 to 404-3). Specifically, for example, the measurement points may be selected so that the measurement positions AF1, AF2, AF3, and AF4 shown in FIG. 4 correspond to the measurement points at the two ends of the measurement points 401-1, 401-3, and 402-1 shown in FIG. 3A. The focus error and leveling error measured at this time are errors before entering the illumination area 12W Therefore, it is sufficient to control the posture of the wafer 14 so as to eliminate these errors when the time during which the wafer 14 is scanned over the distance between the first row of measurement points (401-1 to 401-3) and the second row of measurement points (402-1) elapses. Therefore, it is possible to prevent a delay in posture control of the Z-tilt stage 19.

Further, while the measurement points (AF1 to AF5) in the first to third embodiments were freely selected from among 21 measurement points (401-1 to 401-3, 402-1 to 402-3, and 404-1 to 404-3), the measurement points are not limited to 21 points. It is sufficient if there are at least the measurement points (AF1 to AF5) used for the focus/leveling control.

Further, in the above first to third embodiments, the case was shown of the illumination area 12W being made to relatively scan the wafer 14 from the outside to the inside, but when being moved for scanning it from the inside to the outside, the sequence may be reversed. Specifically, for example, in the case of scanning exposure in the order of FIG. 4C, FIG. 4B, and FIG. 4A, it is sufficient to perform focusing control and leveling control until the state shown in FIG. 4C, control only the focus in the state between FIG. 4C and FIG. 4B, maintain (fix) the leveling in the state of leveling of FIG. 4C for example, and maintain (fix) the focus state of FIG. 4B when changing to FIG. 4B to FIG. 4A.

Other Embodiments

The present invention is not limited to the above embodiments and may be modified in various ways within the scope of the present invention.

For example, the projection optical system 13 shown in FIG. 1 was made one with all optical elements comprised of refraction elements (lenses), but it may also be an optical system comprised of only reflection elements (mirrors etc.) or may be a catadioptric optical system comprised of refraction elements and reflection elements (concave mirrors, regular mirrors, etc.) Further, the projection optical system 13 is not limited to a reduction optical system and may also be an equivalent size optical system or enlargement optical system.

Further, the exposure apparatus (30) is not particularly limited. It is not limited to an exposure apparatus using g-rays (436 nm), i-rays (365 nm), a KrF excimer laser (248 nm), ArF excimer laser (193 nm), $F_2$ laser (157 nm), or YAG laser or other harmonic wave as an exposure light source and also includes an x-ray exposure apparatus, electron beam (EB) exposure apparatus, etc.

Further, as the light source, an SOR for generating extreme ultraviolet (EUV) light having an oscillation spectrum in the soft x-ray region, reduction projection type scanning exposure apparatus using a laser plasma light source etc., or proximity system x-ray scanning exposure apparatus may be used.

Note that the exposure apparatus 30 is produced by electrically, mechanically, and optically connecting the component elements explained in FIG. 1 and FIG. 2.

Further, semiconductor devices, liquid crystal displays, thin-film magnetic heads, and other devices are produced using the above exposure apparatuses and exposure methods.

As explained above, according to the present invention, it is possible to provide an exposure apparatus, exposure method, and process of production of a device of the so-called step-and-scan system exposure method which enable prevention of defocus at the time of exposure at the periphery of the substrate and further which are superior in productivity (throughput).

Note that the embodiments explained above were given only to facilitate understanding of the present invention and were not given to limit the invention. Therefore, the elements disclosed in the above embodiments include all design modifications and equivalents falling within the technical scope of the present invention.

What is claimed is:

1. An exposure apparatus making a mask and a substrate move synchronously with respect to a projection optical system so as to transfer an image of a pattern formed on the mask onto the substrate, said exposure apparatus comprising:
a sensor that detects positional information of the substrate in a direction of an optical axis of the projection optical system at a plurality of measurement points,
an adjusting device, connected to said sensor, that adjusts a position of the substrate in the direction of the optical axis by focusing control and a tilt condition of the substrate by leveling control based on the detected result of said sensor, and
a control switching device, connected to said adjusting device, that switches control while the image of the pattern is transferred onto the substrate so as to perform only said focusing control since a measurement point of the sensor is positioned inside an effective area of the substrate and so as to additionally perform leveling control when a plurality of measurement points that is less than all of the measurement points is positioned inside the effective area of the substrate.

2. The exposure apparatus according to claim 1, further comprising a determining device, connected to the sensor, that determines a position of the measurement points in a plane perpendicular to the axis of the projection optical system based on position information of a shot area to be exposed in the substrate.

3. The exposure apparatus according to claim 2, which when the shot area of the substrate is at the periphery of the substrate,
defines a length required for leveling control in a non-scanning direction perpendicular to a direction of synchronous movement of the substrate as L1 and a length of the shot area on the substrate in the non-scanning direction as L2,
hypothesizes, inside said shot area, a surface area S1 of a first rectangular shape having a side of a length of the length L1, having a first corner intersect with an edge of the substrate, and having an opposite corner of the first corner overlap with a corner of the shot area close to the center of the substrate,
hypothesizes, inside said shot area, a surface area S2 of a second rectangular shape having a side of a length of the length L2, having a second corner intersect with an edge of the substrate, and having an opposite corner of the second corner overlap with a corner of the shot area close to the center of the substrate, and
said determining device compares the surface area S1 of the first rectangular shape and the surface area S2 of the second rectangular shape and determines the measurement points positioned inside the larger surface area.

4. The exposure apparatus according to claim 1, wherein said leveling control is performed in only a non-scanning direction perpendicularly intersecting the direction of synchronous movement of the mask and the substrate.

5. The exposure apparatus according to claim 1, wherein the measurement points are arranged within an illumination area of an exposure beam.

6. An exposure apparatus using an exposure beam to illuminate a substrate through a mask and a projection optical system and making an illumination area of the exposure beam relatively scan the substrate so as to transfer an image of a pattern on the mask onto the substrate, said exposure apparatus comprising:
a detector that detects positional information along a direction of an optical axis of the projection optical system at a plurality of measurement points set at positions in a predetermined relationship with respect to the illumination area, and
a posture controller, connected to said detector, that controls a posture of the substrate with respect to an image plane of the projection optical system based on the positional information during the scanning exposure,
the posture controller includes a switching device that switches between a first control for performing only focusing control for adjusting a position of said substrate in the direction of the optical axis of the projection optical system and a second control for performing both focusing control and leveling control for adjusting a tilt condition of said substrate based on a relative positional relationship between the plurality of measurement points and the substrate during the scanning exposure.

7. The exposure apparatus according to claim 6, wherein the plurality of measurement points are positioned in the illumination area on the substrate.

8. An exposure method making a mask and a substrate move synchronously with respect to a projection optical system so as to make an illumination area of an exposure beam passing through the projection optical system relatively scan a shot area on the substrate to expose the shot area, comprising:
making said illumination area of the exposure beam relatively scan a shot area positioned at a periphery of the substrate from the outside of the substrate to the inside,
starting, during scanning exposure operation for the shot area, only focusing control for adjusting a position of said substrate in a direction of an optical axis of the projection optical system when a measurement point of a plurality of measurement points for detection of positional information of the substrate in the direction of the optical axis of the projection optical system is positioned inside an effective area of the substrate, and
starting, during the scanning exposure operation for the shot area, additionally leveling control for adjusting a tilt condition of said substrate when a plurality of measurement points that is less than all of the measurement points is positioned inside the effective area of the substrate.

9. The exposure method according to claim 8, further determining a position of the measurement points in a plane perpendicular to the optical axis of the projection optical system based on position information of a shot area to be exposed in the substrate.

10. The exposure method according to claim 9, which, when the shot area of the substrate is at the periphery of the substrate,
defines a length required for leveling control in a non-scanning direction perpendicular to a direction of synchronous movement of the substrate as L1 and a length of the shot area on the substrate in the non-scanning direction as L2,
hypothesizes, inside said shot area, a surface area S1 of a first rectangular shape having a side of a length of the length L1, having a first corner intersect with an edge of the substrate, and having an opposite corner of the first corner overlap with a corner of the shot area close to the center of the substrate,
hypothesizes, inside said shot area, a surface area S2 of a second rectangular shape having a side of a length of the length L2, having a second corner intersect with an edge of the substrate, and having an opposite corner of the second corner overlap with a corner of the shot area close to the center of the substrate, compares the surface area S1 of the first rectangular shape and the surface area S2 of the second rectangular shape and determines the measurement points positioned inside the larger surface area.

11. The exposure method according to claim 8, wherein during said leveling control, leveling control is performed in only a non-scanning direction perpendicularly intersecting the direction of synchronous movement of the mask and the substrate.

12. The exposure apparatus according to claim 8, wherein the measurement points are arranged within the illumination area.

13. An exposure method using an exposure beam to illuminate a substrate through a mask and a projection optical system and making an illumination area of the exposure beam relatively scan the substrate so as to transfer an image of a pattern on the mask onto the substrate, said method comprising the steps of:

detecting positional information along a direction of an optical axis of the projection optical system at a plurality of measurement points set at positions in a predetermined relationship with respect to the illumination area, and controlling a posture of the substrate with respect to an image plane of the projection optical system based on the positional information during the scanning exposure, the step of controlling the posture including a step of switching between a first control for performing only focusing control for adjusting a position of the substrate in the direction of the optical axis of the projection optical system and a second control for performing both focusing control and leveling control for adjusting a tilt condition of the substrate based on relative positional relationship between the plurality of measurement points and the substrate during the scanning exposure.

14. The exposure method according to claim 13, further comprising a step of obtaining positional information of measurement points positioned in an effective area of said substrate based on relative positional information of said substrate and said plurality of measurement points during said scanning exposure.

15. The exposure method according to claim 13, wherein said leveling control includes at least one of leveling control in a scanning direction of said substrate and leveling control in a non-scanning direction perpendicularly intersecting said scanning direction.

16. The exposure method according to claim 13, which, when making said illumination area relatively scan a shot area positioned at a periphery of said substrate from an outside of the substrate in an inside, performs the first control until two measurement points separated by at least a predetermined length in said scanning direction or said non-scanning direction reach an effective area of said substrate and performs said second control from when said two measurement points reach said effective area.

17. The exposure method according to claim 13, wherein the plurality of measurement points are positioned in the illumination area on the substrate.

18. A process for production of a device comprising:

making an illumination area of an exposure beam passing through a projection optical system relatively scan a shot area positioned at a periphery of a substrate from the outside of the substrate to the inside, starting, during scanning exposure operation for the shot area, only focusing control for adjusting a position of said substrate in a direction of an optical axis of the projection optical system when a measurement point of a plurality of measurement points for detection of positional information of the substrate in the direction of the optical axis of the projection optical system is positioned inside an effective area of the substrate, starting, during the scanning exposure operation for the shot area, additionally leveling control for adjusting a tilt condition of said substrate when a plurality of measurement points that is less than all of the measurement points is positioned inside the effective area of the substrate, and exposing the shot area by transferring an image of a pattern on a mask on to the substrate.

19. A process for production of a device comprising the steps of:

detecting positional information of a substrate along a direction of an optical axis of a projection optical system at a plurality of measurement points set at positions in a predetermined relationship with respect to an illumination area of an exposure beam passing through the projection optical system, controlling a posture of the substrate with respect to an image plane of the projection optical system based on the positional information during scanning exposure, switching between a first control for performing only focusing control for adjusting a position of the substrate in the direction of an optical axis of the projection optical system and a second control for performing both focusing control and leveling control for adjusting a tilt condition of the substrate based on relative positional relationship between the plurality of measurement points and the substrate during the scanning exposure, and using the exposure beam to illuminate the substrate through a mask and the projection optical system and making the illumination area of the exposure beam relatively scan the substrate so as to transfer an image of a pattern on the mask onto the substrate.

20. A process for production of an exposure apparatus for making a mask and a substrate move synchronously with respect to a projection optical system so as to transfer an image of a pattern formed on the mask on to the substrate, comprising the steps of;

providing a sensor that detects positional information of the substrate in a direction of an optical axis of the projection optical system at a plurality of measurement points, providing an adjusting device, connected to said sensor, that adjusts a position of the substrate in the direction of the optical axis by focusing control and a tilt condition of the substrate by leveling control based on a result of detection of said sensor, and providing a control switching device, connected to said adjusting device, that switches control while the image of the pattern is transferred onto the substrate so as to perform only said focusing control since a measurement point of the sensor is positioned inside an effective area of the substrate and so as to additionally perform leveling control when a plurality of measurement points that is less than all of the measurement points is positioned inside the effective area of the substrate.

21. A process for production of an exposure apparatus using an exposure beam to illuminate a substrate through a mask and a projection optical system and making an illumination area of the exposure beam relatively scan the substrate so as to transfer an image of a pattern on the mask onto the substrate, comprising the steps of:

providing a detector that detects positional information along a direction of an optical axis of the projection optical system at a plurality of measurement points set at positions in a predetermined relationship with respect to the illumination area, and providing a posture controller, connected to said detector, that controls the posture of the substrate with respect to an image plane of the projection optical system based on the positional information during the scanning exposure and includes a switching device that switches between a first control for performing only focusing control for adjusting a position of said substrate in the direction of the optical axis of the projection optical system and a second control for performing both focusing control and leveling control for adjusting a tilt condition of said substrate based on a relative positional relationship between the plurality of measurement points and the substrate during the scanning exposure.

* * * * *